(12) United States Patent
Harrison

(10) Patent No.: US 7,392,480 B2
(45) Date of Patent: Jun. 24, 2008

(54) ENGINEERING DRAWING DATA EXTRACTION SOFTWARE

(75) Inventor: Bruce L. Harrison, Columbia, CT (US)

(73) Assignee: United Technologies Corporation, Hartford, CT (US)

( * ) Notice: Subject to any disclaimer, the term of this patent is extended or adjusted under 35 U.S.C. 154(b) by 847 days.

(21) Appl. No.: 10/611,036

(22) Filed: Jun. 30, 2003

(65) Prior Publication Data

US 2004/0267401 A1    Dec. 30, 2004

(51) Int. Cl.
*G06F 17/30* (2006.01)
*G06F 19/00* (2006.01)

(52) U.S. Cl. ........................ 715/715; 715/964

(58) Field of Classification Search ........ 715/941, 715/715, 808, 809, 767, 802, 964, 744–747, 715/771–773, 800, 801, 805; 702/182, 127
See application file for complete search history.

(56) References Cited

U.S. PATENT DOCUMENTS

| 5,689,435 | A | | 11/1997 | Umney et al. | |
|---|---|---|---|---|---|
| 5,847,956 | A | * | 12/1998 | Bronfeld et al. | 700/98 |
| 6,970,966 | B2 | * | 11/2005 | Gemelli et al. | 710/305 |
| 7,088,378 | B1 | * | 8/2006 | Engstrom et al. | 715/715 |
| 2002/0065747 | A1 | * | 5/2002 | Nagano et al. | 705/27 |
| 2002/0113784 | A1 | * | 8/2002 | Feilmeier et al. | 345/419 |
| 2003/0098862 | A1 | * | 5/2003 | Hunt et al. | 345/418 |
| 2004/0090439 | A1 | * | 5/2004 | Dillner | 345/440 |
| 2004/0098292 | A1 | * | 5/2004 | Miller et al. | 705/8 |
| 2004/0130702 | A1 | * | 7/2004 | Jupp et al. | 356/5.01 |
| 2007/0156373 | A1 | * | 7/2007 | Yamashita et al. | 702/182 |

FOREIGN PATENT DOCUMENTS

EP          1 233 377 A2     8/2002
JP          10003310 A    *  1/1998

OTHER PUBLICATIONS

European Search Report, Dated Oct. 15, 2007, European Patent Application No. 04253923.9-1225.
Jung T et al. "Annotating and sketching on 3D Web models".

* cited by examiner

*Primary Examiner*—Steven P. Sax
(74) *Attorney, Agent, or Firm*—Bachman & LaPointe, P.C.

(57) ABSTRACT

A method for extracting data from a computer aided design (CAD) file comprising the steps of displaying at least one part attribute stored in the CAD file on a computer display, ballooning the at least one part attribute, extracting data based upon the ballooned at least one part attribute, passing the extracted data to a user interface for display, editing the extracted data displayed on the user interface, and saving the edited extracted data.

12 Claims, 5 Drawing Sheets

23

| 1. Part Number | 2. Eng. Chg. | 3. Part Name | | 4. Serial/Identification Number | |
|---|---|---|---|---|---|
| 123002 | | EXERCISE "B" | | | |
| 27. SEQ NO | 28. BP LOC | 29. CHARACTERISTIC | 30. ACTUAL | 31. INSPECTION METHOD | 32. INSP STAMP |
| 1 | 8G-1 | 63 SURFACE FINISH | | | |
| 2 | 8G-1 | .003-.015 BREAK EDGE | | | |
| 3 | 8G-1 | .005-.020 RADIUS | | | |
| 4 | 7F-1 | ⌖ 0.0100 AB(S) | | | |
| 5 | 8D-1 | .250-28 UNF-2B THREAD CALLOUT | | | |
| 6 | 8D-1 | .2113-.2173 MINOR DIAMETER | | | |
| 7 | 8D-1 | ⌖ 0.010(M)AB(M)K(M) | | | |
| 8 | 8D-1 | .250-.280 X 40° +/-5° CHAMFER | | | |
| 9 | 8B-1 | ⌒ .020 ABC | | | |
| 10 | 5E-1 | .365-.385 DIAMETER | | | |
| 11 | 5E-1 | ⌖ 0.010(M)AB(M) | | | |
| 12 | 5D-1 | .249-.251 DIAMETER | | | |
| 13 | 5D-1 | ⌖ 0.002(M)AB(M) | | | |
| 14 | 5D-1 | .350-.400 DEPTH | | | |
| 15 | 5B-1 | .250 MIN DIMENSION | | | |
| 16 | 3F-1 | 3.490-3.510 DIMENSION | | | |
| 17 | 3E-1 | .495-.505 DIMENSION | | | |
| 18 | 4D-1 | ⌒ 0.002(M)AB(M) | | | |
| 19M | 4D-1 | .999-1.001 DIAMETER | | | |
| 20 | 4C-1 | 32 SURACE FINISH | | | |
| 21 | 3C-1 | .234-.266 RADIUS | | | |
| 22 | 3B-1 | .115-.135 X 45°+/-5° CHAMFER | | | |
| 23 | 2C-1 | 22.0000 +/- .5000 ANGLE | | | |
| 24 | 2D-1 | 1.480-1.500 DIA AT 3.250 GAGE DIM | | | |
| 25 | 2C-1 | RADIUS | | | |
| 26 | 2C-1 | 2.490-2.510 DIAMETER | | | |
| 27 | 1D-1 | 4.950-5.005 DIAMETER | | | |

P&W F-8097 CONT. (REV. 5/01)     PAGE 2 OF 3

*FIG. 2*
(PRIOR ART)

| 1. Part Number | 2. Eng. Chg. | 3. Part Name | 4. Serial/Identification Number | |
|---|---|---|---|---|
| 123002 | | Exercise B | | |

| 27. Seq. No. | 28. BP Loc | 29. Characteristic | 30. Actual | 31. Inspection Method | 32. Insp. Stamp |
|---|---|---|---|---|---|
| 1 | 8G-1 | 63 SURFACE FINISH<br>UOS ALL SURF<br>SURF TEXTURE PER SPEC PWA 388<br>REF DWG NOTE 4 | | | |
| 2 | 8G-1 | .003-.015 BREAK EDGE<br>UOS<br>REF DWG NOTE 5 | | | |
| 3 | 8G-1 | .005-.020 RADIUS<br>UOS COR FILLETS<br>REF DWG NOTE 6 | | | |
| 4 | 7F-1 | POSDIA.010(M)AB(M)<br>UOS ALL FINISHED DIAMETERS<br>REF DWG NOTE 9 | | | |
| 5 | 8D-1 | .250-28 UNF-2B THREAD CALLOUT<br>4X<br>THREADS PER SPEC PWA 355<br>REF DWG NOTE 11 | | | |
| 11 | 5E-1 | POSDIA.010(M)AB(M)<br>8X | | | |
| 12 | 5D-1 | .249-.251 DIAMETER | | | |
| 13 | 5D-1 | POSDIA.002(M)AB(M)<br>RACETRACK U<br>ANGULAR RELATION TO OTHER FEATURES<br>NOT IMPORTANT<br>REF DWG NOTE 8 | | | |
| 14 | 5D-1 | .350-.400 DEPTH | | | |
| 15 | 5B-1 | .250 MIN DIMENSION<br>BOTH SIDES 8X | | | |
| 16 | 3F-1 | 3.490-3.510 DIMENSION | | | |
| 17 | 3E-1 | .495-.505 DIMENSION | | | |
| 18 | 4D-1 | FLT.002 | | | |
| 19M | 4D-1 | .999-1.001 DIAMETER<br>DATUM B<br>MAJOR CHARACTERISTIC<br>KEY CHARACTERISTIC<br>KEY CHARACTERISTICS PER SPEC PWA 304.<br>REF DWG NOTE 10 | | | |

| MQI 19 M | Feature Code/Sample Plan |
|---|---|
| | OPER CERT |
| Feature Description | B/P Loc |
| .999-1.001 DIAMETER | 4D-1 |
| DATUM B<br>MAJOR CHARACTERISTIC<br>KEY CHARACTERISTIC<br>KEY CHARACTERISTICS PER SPEC PWA 304.<br>REF DWG NOTE 10 | |

*FIG. 5*

ENGINEERING DRAWING DATA EXTRACTION SOFTWARE

BACKGROUND OF THE INVENTION (1) Field of the Invention

The present invention relates to a method for extracting data from an engineering drawing file format.

(2) Description of Related Art

It is common in the field of manufacturing to make use of an electronic repository of design data such as computer aided design (CAD) software packages for the definition and description of machinable parts. In particular, in the field of aerospace engineering, it is common for engineers and other appropriate personnel to annotate the information contained in a CAD file so as to produce Manufacturing/Quality Work Instructions (MQIs) and to generate First Article Inspection (FAI) documents for use by both internal and external suppliers of parts. With reference to FIG. 1, there is illustrated the present process by which information is manually retrieved from a CAD file and manipulated to be formatted so as to be utilized in an MQI or an FAI.

CAD drawing 11 is manually marked-up or "ballooned" to include balloon numbers 13. A balloon number is a unique identifying number encapsulated in a circle drawn in close proximity to a part number to which it refers. While any manner of uniquely identifying unique parts may be utilized, it is common in the art to utilize such a system of ballooning. Once the relevant parts have been annotated with a balloon number 13, the information recorded upon CAD drawing 11 is manually transcribed into an FAI format 23 as illustrated in FIG. 2. With reference to FIG. 2, there is illustrated an intermediate format 23 known in the art. Intermediate format 23 is a hand written description of the desired parameters transcribed from CAD drawing 11. In the example shown in FIG. 2, intermediate format 23 records a sequence number, a blueprint location 17, and a characteristic of the part. Usually, sequence number refers to the unique number contained inside of balloon number 13. The blueprint location is the coordinate on the blueprint where the part is located. Lastly, there is usually recorded at least one characteristic of each part. With continued reference to FIG. 1, the information recorded upon intermediate format 23 is transferred, usually through a graphical user interface, into a database. This is accomplished through data entry interface 15. Data entry interface 15 is comprised of a plurality of text fields, radio buttons and the like through which information may be entered pertaining to each part delimited with a balloon number 13 on CAD drawing 11. For example, a blueprint location 17, in this case "4D-1", and the feature type 19 designating that the diameter of the part is to be 1.0±0.001 units are entered. Additional information may be entered, including but not limited to, quantity of characteristics 50, feature description 51, safety characteristic 52, nominal size 53, and tolerance 54.

Once all of the information contained in intermediate format 23 has been entered in this manner by a data entry interface 15 into a database (not shown), the data so stored may be used to generate one or more final reports 18. Usually these final reports take the form of either an MQI or an FAI. Final report is created using data displayed and entered upon data entry interface 15. Additional information 56 may then be added to data entry interface 15. Such data may include, but is not limited to, general text that adds clarity to the requirement and drawing notes.

Unfortunately, the process described above is prone to errors as the data is entered by hand, is reformatted, and often times has mental calculations performed upon it by the person or persons entering the data. What is therefore needed is a method for extracting the data contained in a CAD file in an automated fashion so as to remove user error, and avoid excessive delay in moving from the completed CAD file of a part through to the generation of the MQI and the FAI.

SUMMARY OF THE INVENTION

Accordingly, it is an object of the present invention to provide a method for extracting data from an engineering drawing file format.

In accordance with the present invention, a method for extracting data from a computer aided design (CAD) file comprises the steps of displaying at least one part attribute stored in the CAD file on a computer display, ballooning the at least one part attribute, extracting data based upon the ballooned at least one part attribute, passing the extracted data to a user interface for display, editing the extracted data displayed on the user interface, and saving the edited extracted data.

In accordance with the present invention, an apparatus for extracting data from a computer aided design (CAD) file comprises a CAD file, a computer, a computer display, and a software application running on the computer adapted to display the CAD file on the computer display, enable the extraction of data from the CAD file, enable the editing of the extracted data, and enable the saving of the extracted data.

BRIEF DESCRIPTION OF THE DRAWINGS

FIG. 2 is a diagram of the intermediate format known in the art.

FIG. 5 is a diagram of the intermediate format of the present invention for use in creating reports.

DETAILED DESCRIPTION OF THE PREFERRED EMBODIMENT(S)

The present invention herein provides a method of extracting data from a CAD file, specifically embedded and non-embedded requirements, so as to process the data for use in downstream functions, such as the production of MQIs and FAIs. In a preferred embodiment, the present invention is implemented through a software application capable of interaction with a commercial computer aided design (CAD) package, preferably Unnigraphics (UG).

Figure 1:
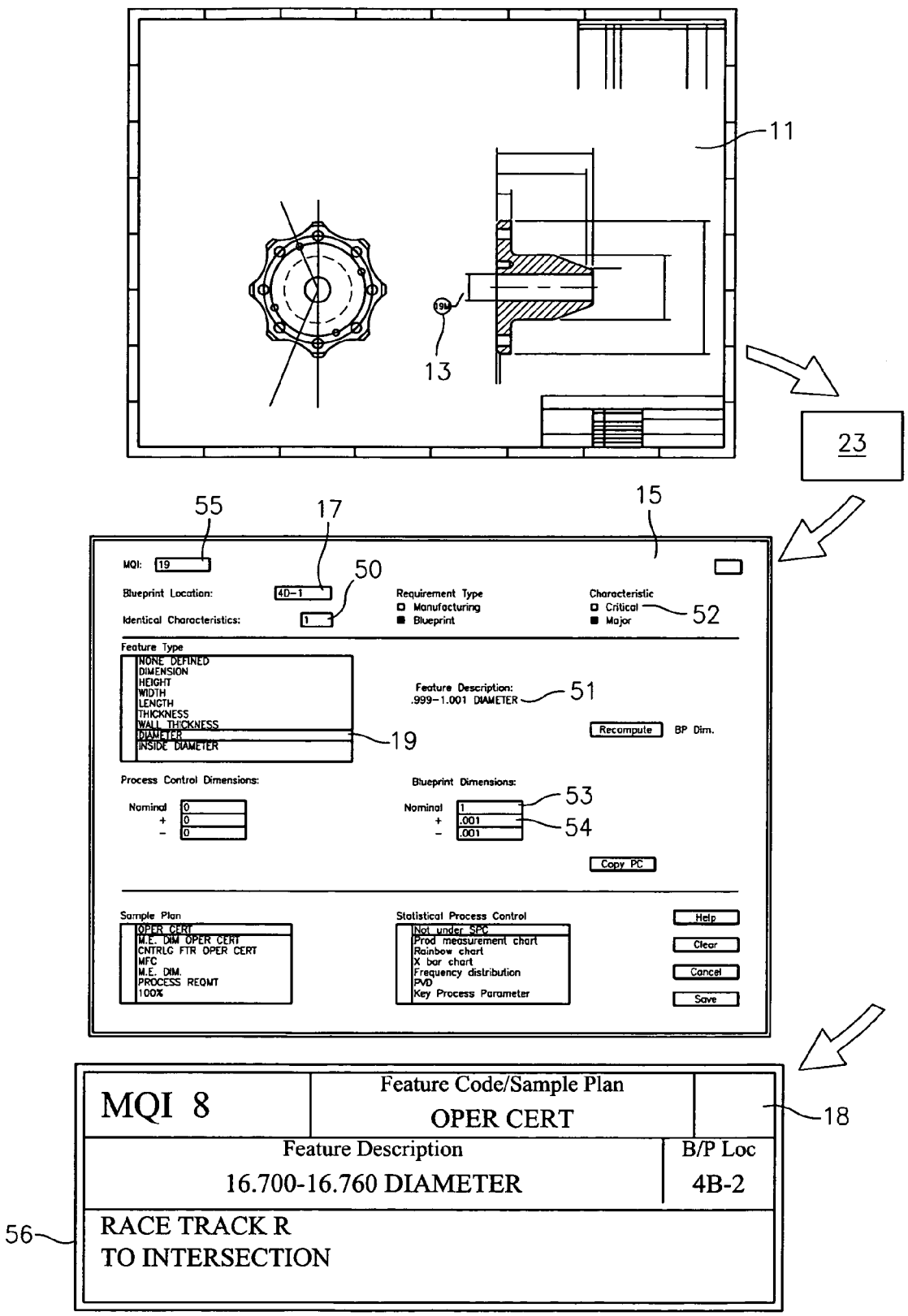
FIG. 1 is a diagram of the method for extracting CAD data known in the art.
Figure 3:
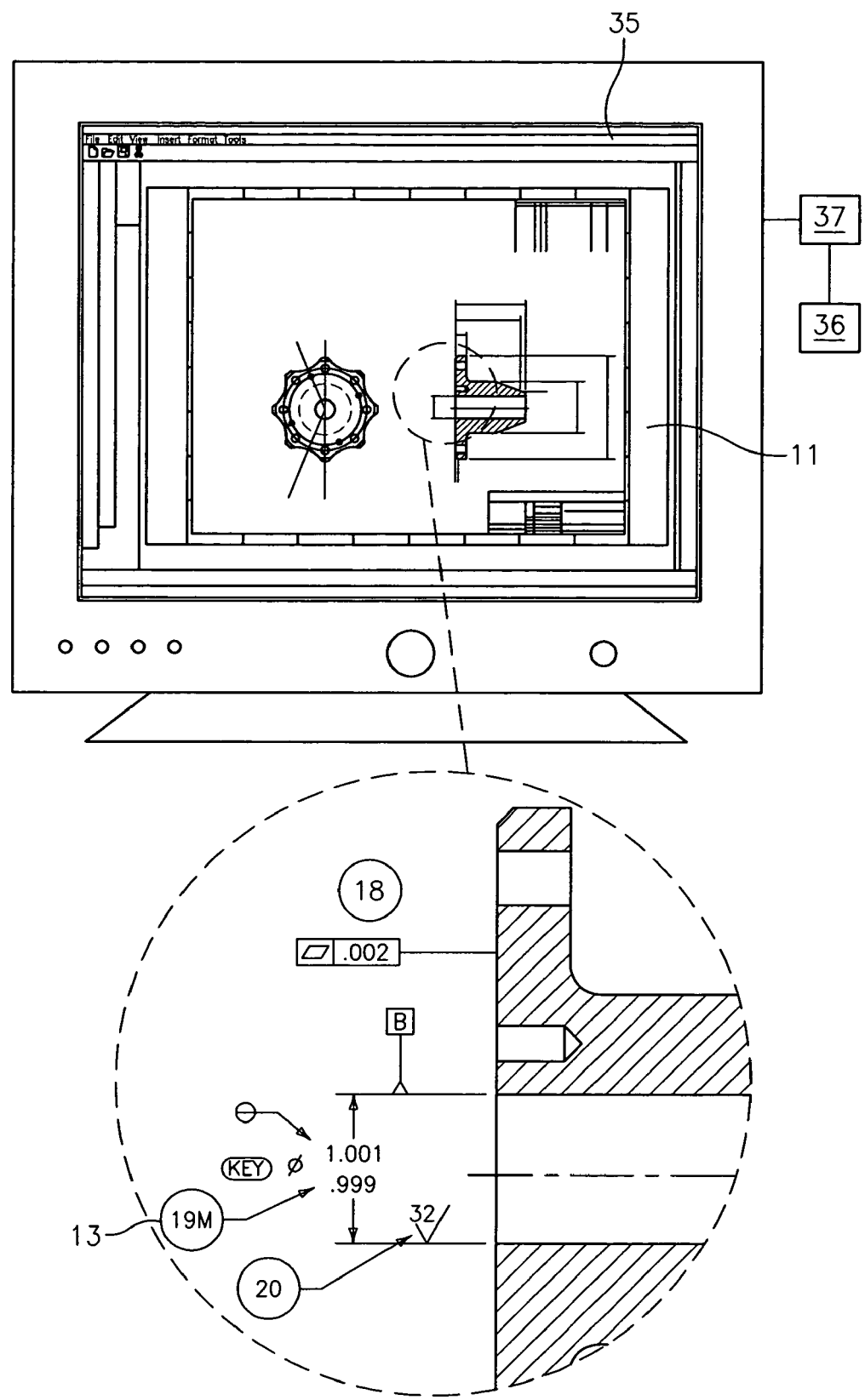
FIG. 3 is a diagram of the system of the present of the present invention.

With reference to FIG. 3, there is illustrated the manner in which the present invention automates and facilitates the extraction of data from CAD files. In a preferred embodiment, the present invention allows a user to view a CAD drawing 11 in a non-paper format. Preferably, this non-paper format consists of displaying an image upon a computer display 35. Once the CAD drawing 11 is displayed upon computer display 35, the user may manipulate a cursor or interact through any similar protocol to select aspects of the part or parts displayed within CAD drawing 11. In a preferred embodiment, the user manipulates a cursor, places it over or in close proximity to the part attribute and clicks upon a mouse or enters an appropriate key stroke to a key board sufficient to designate the part attribute. Upon designating a part, computer 37, in communication with computer screen 35, causes a balloon number 13 to be displayed in CAD drawing 11.

As illustrated herein, balloon number 13 is shown in exemplary fashion comprised of a unique number identifier enclosed in a circle. While illustrated in this manner, the present invention is not so limited. Rather, the present invention is drawn to allowing a user to designate part attributes in any manner such that a visual representation of a selection of a part attribute is displayed upon CAD drawing 11. In a preferred embodiment, balloon number 13 makes use of a color coded system wherein each color is indicative of a part attribute. For example, balloon number 11 may be color coded as orange to indicate that a particular balloon number 13 refers to a part which has already been selected by the user. Once a user has selected the part attributes to be designated with a balloon number 13, the system of the present invention operates to extract the relevant information concerning the part attribute from the CAD file which forms the description for CAD drawing 11 and passes the extracted data relevant to each part attribute to user interface 31.

Figure 4:
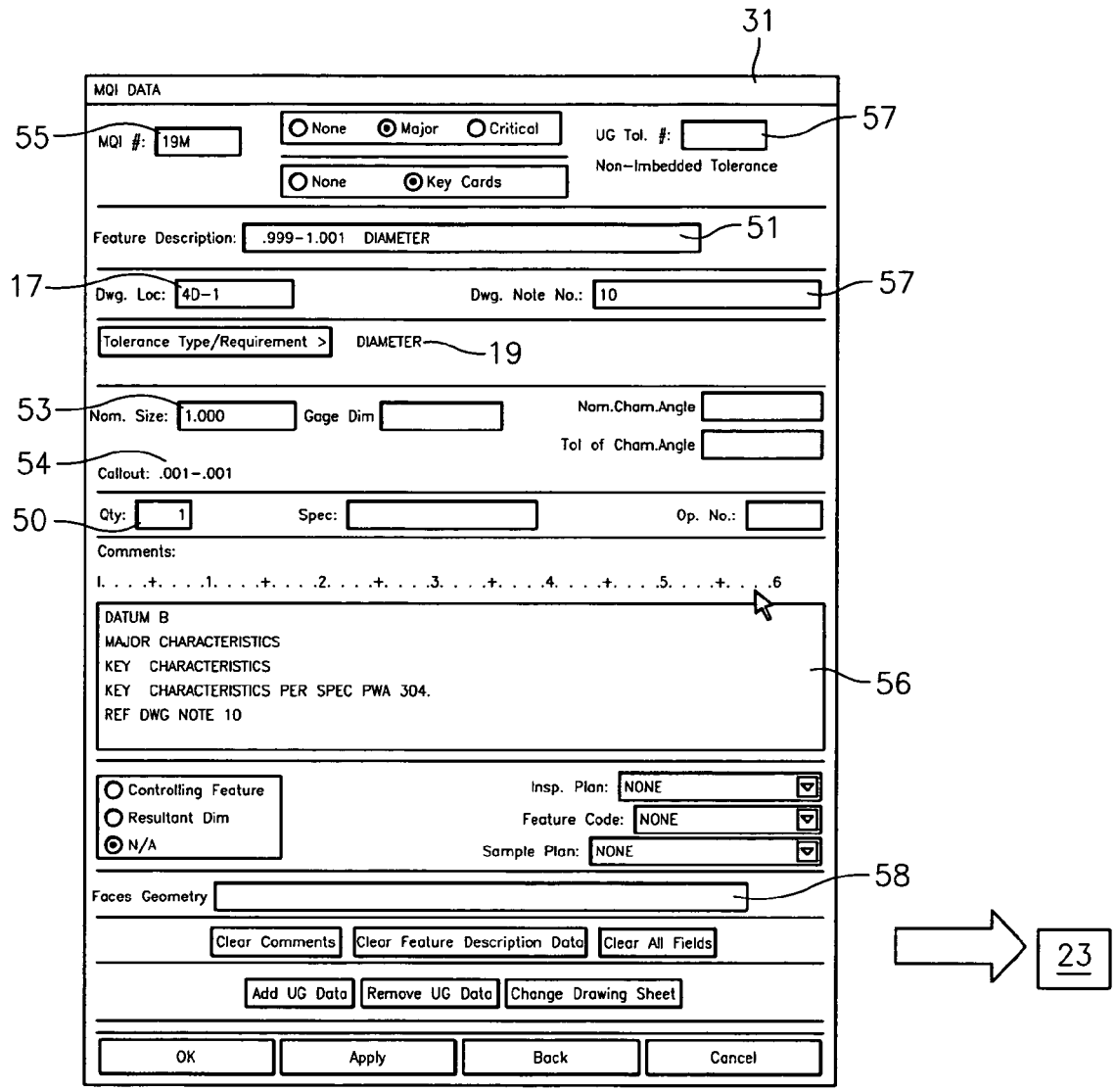
FIG. 4 is a diagram of a user interface of the present invention.

With reference to FIG. 4, there is illustrated a preferred user interface 31 of the present invention. Preferably, user interface 31 is a graphical user interface of any design sufficient to allow the display of part attributes retrieved from the data comprising CAD drawing 11 capable of being edited by the user. Once the user edits or otherwise confirms the data displayed in user interface 31, the data is saved. In a preferred embodiment, the data is saved in the original CAD file from which CAD drawing 11 was derived. In yet another embodiment, the information entered by a user when designating balloon numbers 13 is stored in a separate relational database 36 in communication with computer 37.

Regardless of the manner in which such data is stored, it is subsequently retrieved by the system of the present invention to produce downstream reports such as that of an MQI or FAI as illustrated in FIG. 5. Data retrieved, entered, or edited via user interface 31 is displayed within the intermediate format 23 of the present invention. The data which is displayed in intermediate format 23 of the present invention may be imported in whole or in part by report generation interface 61. The report generation interface 61 provides for the importation of the data edited through the method of the present invention so as to allow a user to generate downstream reports such as an MQI or an FAI as illustrated.

In a preferred embodiment, the system of the present invention may be used to provide a balloon number 13 to every part attribute, or a designated subset of part attributes, absent any intervention by a user. Such a mode allows a user to proceed directly to editing and confirming the data contained in user interface 31 without the necessity of manually selecting which parts attributes to annotate with a balloon number 13. Regardless of the mode by which the method of the present invention is executed, changes to the CAD drawing 11 arising as a result of ballooning or otherwise editing the part attributes displayed, can be saved for later retrieval.

As is evident, the system of the present invention allows for substantial time savings of the related art as there is no longer the need for data reentry. Because much of the data stored by user interface 31 is system generated data, there are fewer mistakes contained within the data.

It is to be understood that the invention is not limited to the illustrations described and shown herein, which are deemed to be merely illustrative of the best modes of carrying out the invention, and which are susceptible of modification of form, size, arrangement of parts and details of operation. The invention rather is intended to encompass all such modifications which are within its spirit and scope as defined by the claims.

What is claimed is:

1. A method for extracting data from a computer aided design (CAD) file comprising the steps of:
    providing a CAD file having a CAD drawing of a machinable part having at least one part attribute;
    displaying said at least one part attribute stored in said CAD file on a computer display;
    ballooning said at least one part attribute;
    color coding said ballooned at least one part attribute according to said at least one part attribute;
    extracting data based upon said ballooned at least one part attribute;
    passing said extracted data to a user interface for display in an intermediate format;
    editing said extracted data displayed on said user interface in said intermediate format;
    saving said edited extracted data;
    importing said edited extracted data; and
    producing at least one report from said retrieved extracted data.

2. The method of claim 1 wherein said at least one report is selected from the group consisting of Manufacturing Quality Instructions (MQIs) and First Article Inspection (FAI) documents.

3. The method of claim 1 wherein said ballooning comprises the steps of:
    manipulating a cursor displayed on said computer screen to select said at least one part attribute; and
    displaying a visual representation indicative of said selection of said at least one part attribute.

4. The method of claim 3, wherein said visual representation comprises a unique number identifier enclosed in a circle.

5. The method of claim 1 wherein saving said edited extracted data comprises saving said edited extracted data in said CAD file.

6. The method of claim 1 wherein saving said edited extracted data comprises saving said edited extracted data in a relational database.

7. A method for extracting data from a computer aided design (CAD) file comprising the steps of:
    providing a CAD file having a CAD drawing of a machinable part having at least one part attribute;
    ballooning said at least one part attribute in an automated manner;
    color coding said ballooned at least one part attribute according to said at least one part attribute;
    extracting data based upon said ballooned at least one part attribute;
    passing said extracted data to a user interface for display in an intermediate report;
    editing said extracted data displayed on said user interface in said intermediate report;
    saving said edited extracted data;
    importing said edited extracted data; and
    producing at least one report from said retrieved extracted data.

8. The method of claim 7 wherein said at least one report is selected from the group consisting of Manufacturing Quality Instructions (MQIs) and First Article Inspection (FAI) documents.

9. The method of claim 8 where saving said edited extracted data comprises saving said edited extracted data in said CAD file.

10. The method of claim 8 wherein saving said edited extracted data comprises saving said edited extracted data in a relational database.

11. An apparatus for extracting data from a computer aided design (CAD) file comprising:
- a CAD file of a CAD drawing of a machinable part having at least one part attribute;
- a computer;
- a computer display; and
- a software application running on said computer adapted to display said CAD file on said computer display, enable the color coding of ballooned data according to at least one part attribute of said machinable part, enable the extraction of color coded, ballooned data from said CAD file, enable the editing of said color coded, ballooned extracted data, enable the saving of said extracted data, enable the importation of said color coded, ballooned extracted data, and enable to the production of at least one report using said color coded, ballooned extracted data.

12. The apparatus of claim 11 wherein said at least one report is selected from the group consisting of Manufacturing Quality Instructions (MQIs) and First Article Inspection (FAI) documents.

* * * * *